(12) United States Patent
Dunbar et al.

(10) Patent No.: US 8,323,802 B2
(45) Date of Patent: *Dec. 4, 2012

(54) LIGHT ACTIVATABLE POLYIMIDE COMPOSITIONS FOR RECEIVING SELECTIVE METALIZATION, AND METHODS AND COMPOSITIONS RELATED THERETO

(75) Inventors: Meredith L. Dunbar, Canal Winchester, OH (US); Yueh-Ling Lee, Raleigh, NC (US); Carl B. Wang, Raleigh, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 586 days.

This patent is subject to a terminal disclaimer.

(21) Appl. No.: 12/491,692

(22) Filed: Jun. 25, 2009

(65) Prior Publication Data

US 2009/0263639 A1    Oct. 22, 2009

Related U.S. Application Data

(63) Continuation-in-part of application No. 10/969,430, filed on Oct. 20, 2004, now abandoned.

(51) Int. Cl.
   *B32B 27/06* (2006.01)
(52) U.S. Cl. ............ 428/473.5; 427/133; 427/554; 428/220; 428/474.5; 528/310
(58) Field of Classification Search .......... 428/220, 428/473.5, 474.5; 524/407; 427/133, 554
See application file for complete search history.

(56) References Cited

U.S. PATENT DOCUMENTS

| | | | |
|---|---|---|---|
| 4,159,414 A | 6/1979 | Suh et al. | |
| 4,694,138 A | 9/1987 | Oodaira et al. | |
| 5,780,201 A * | 7/1998 | Sabnis et al. | 430/270.1 |
| 6,150,456 A | 11/2000 | Lee et al. | |
| 6,319,564 B1 | 11/2001 | Naundorf et al. | |
| 6,657,849 B1 | 12/2003 | Andresakis et al. | |
| 6,696,173 B1 | 2/2004 | Naundorf et al. | |
| 7,115,681 B2 | 10/2006 | Shimo-Ohsako et al. | |
| 7,504,150 B2 * | 3/2009 | Lee et al. | 428/220 |
| 2004/0185388 A1 | 9/2004 | Hirai | |
| 2004/0241422 A1 | 12/2004 | Naundorf et al. | |
| 2005/0064711 A1 | 3/2005 | Kliesch et al. | |

FOREIGN PATENT DOCUMENTS

| | | |
|---|---|---|
| DE | 101 32 092 A1 | 1/2003 |
| EP | 0 256 778 | 2/1988 |
| EP | 0 902 048 A1 | 3/1999 |
| EP | 1 130 189 A2 | 2/2001 |
| EP | 1 367 872 A2 | 12/2003 |
| EP | 1531657 A | 5/2005 |
| EP | 1650249 A | 4/2006 |
| EP | 1734071 A | 12/2006 |
| EP | 1912227 A | 4/2008 |
| WO | EP 0902048 | * 3/1999 |
| WO | EP 1367872 | * 12/2003 |

OTHER PUBLICATIONS

Database WPI Week 199414, Thomson Scientific, London, GB; AN 1994-114843, XP002488369—& JP 06 064090 A (Hitachi Chem Co Ltd), Mar. 8, 1994.
U.S. Appl. No. 11/153,176, filed Jun. 15, 2005, Yueh-Ling Lee et al.
U.S. Appl. No. 11/153,206, filed Jun. 15, 2005, Yueh-Ling Lee et al.
U.S. Appl. No. 11/891,129, filed Aug. 9, 2007, Yueh-Ling Lee et al.
U.S. Appl. No. 12/169,186, filed Jul. 8, 2008, Yueh-Ling Lee et al.
U.S. Appl. No. 12/169,212, filed Jul. 8, 2008, Yueh-Ling Lee et al.

\* cited by examiner

*Primary Examiner* — Gregory Listvoyb

(57) ABSTRACT

The present invention relates generally to polyimide composites having dispersed in the polyimide base matrix, useful spinel crystal fillers wherein the composite has a visible-to-infrared light extinction coefficient between and including 0.05 and 0.60 microns$^{-1}$. The composite polyimides formed therefrom are typically used to make circuits having fine electrically conductive pathways adjacent to the polyimide substrate. These fine electrically conductive pathways are typically formed on the substrate using an electro-less metal plating step. First, the surface of the polyimide composite is light activated, typically by using a laser beam, then the light activated portions are plated to form thin lines, or pathways, on the film's surface.

15 Claims, No Drawings

LIGHT ACTIVATABLE POLYIMIDE COMPOSITIONS FOR RECEIVING SELECTIVE METALIZATION, AND METHODS AND COMPOSITIONS RELATED THERETO

FIELD OF INVENTION

The present invention relates generally to polyimide based dielectrics for supporting fine (e.g., less than 100, 75, 50 or 25 microns in line width) electrical pathways. More specifically, the polyimide based dielectric compositions of the present invention use certain spinel-type fillers for efficient and accurate surface patterning through activation by laser (or other similar type light patterning technique) prior to bulk metallization in a complimentary pattern to the laser induced pattern.

BACKGROUND OF THE INVENTION

Electronic circuits are commonly made from polyimide-metal laminates, using a subtractive process. In such a process, a dielectric is first layered (or laminated) with a solid metal layer, and thereafter, the metal layer is converted to a metal circuit pattern by subtracting away most of the metal. This results in a fine line conductive circuit pattern. Typically, the metal is subtracted away by chemical etching or the like. However, such metal subtraction processes can be expensive, environmentally unfriendly, and increasingly problematic in meeting increasing performance requirements of the industry.

EP 1 367 872 A2 to Goosey et al., is directed to laser activated dielectric material and an electroless deposition process, involving a sensitizing pre-dip and a milling process for incorporating titanium dioxide, aluminum nitride or zirconium dioxide filler into a dielectric coating material, and then ultimately converting the filler (using laser energy) into a metallization catalyst.

SUMMARY OF THE INVENTION

The present invention is directed to polyimide film composites having dispersed therein, highly activatable spinel-type crystal fillers, where the crystal fillers comprise two or more metal oxide cluster configurations within a definable crystal formation. The overall crystal formation, when in an ideal (i.e., non-contaminated, non-derivative) state, will have the following general formula:

$$AB_2O_4$$

Where:
i. A (in one embodiment, A is a metal cation having primarily, if not exclusively, a valance of 2) is selected from a group comprising nickel, copper, cobalt, tin and combinations thereof, which provides the primary cation component of a first metal oxide cluster ("metal oxide cluster 1") typically a tetrahedral structure,
ii. B (in one embodiment, B is a metal cation having primarily, if not exclusively, a valance of 3) is selected from the group comprising chromium, iron, aluminum, nickel, manganese, tin, and combinations thereof and which provides the primary cation component of a second metal oxide cluster ("metal oxide cluster 2") typically an octahedral structure,
iii. where within the above groups A or B, any metal cation having a possible valence of 2 can be used as an "A", and any metal cation having a possible valence of 3 can be used as a "B",
iv. where the geometric configuration of "metal oxide cluster 1" (typically a tetrahedral structure) is different from the geometric configuration of "metal oxide cluster 2" (typically an octahedral structure),
v. where a metal cation from A and B can be used as the metal cation of "metal oxide cluster 2" (typically the octahedral structure), as in the case of an 'inverse' spinel-type crystal structure,
vi. where O is primarily, if not exclusively, oxygen; and
vii. where the "metal oxide cluster 1" and "metal oxide cluster 2" together provide a singular identifiable crystal type structure having heightened susceptibility to electromagnetic radiation evidenced by the following property, when dispersed in a polyimide-based dielectric at a loading of 30 weight percent, a "visible-to-infrared light" (400 nm to 1200 nm) extinction coefficient of the dielectric composite is, between and including any two of the following numbers, 0.05, 0.06, 0.07, 0.08, 0.09, 0.1, 0.2, 0.3, 0.4, 0.5 and 0.6 per micron.

The spinel-type crystal fillers of the present invention can be dispersed in a polyimide precursor matrix, typically a polyamic acid. These fillers are typically dispersed at a weight-percent between and including any two of the following numbers 3, 5, 7, 9, 10, 12, 15, 20, 25, 30, 35, 40, 45, 50, 55 and 60 weight-percent of the polyimide (or polymer precursor).

These spinel-type crystal fillers can be dispersed in a polyimide precursor initially having an average particle size (during incorporation into the matrix) of between and including any two of the following numbers 50, 100, 300, 500, 800, 1000, 2000, 3000, 4000, 5000 and 10000 nanometers.

Typically, the spinel-type crystal fillers of the present invention can first be dispersed in an organic solvent (either with or without the aid of a dispersing agent) and in a subsequent step, dispersed in the polyimide precursor to form a blend. The 'spinel-type crystal filler-polyimide precursor blend' can then be cast onto a flat surface (or drum), heated, dried, and cured to form a polyimide film composite having the spinel-type filler of the present invention dispersed therein.

The polyimide film composites of the present invention can then be processed through a light activation step, typically employing the use of a laser beam. The laser beam can be focussed, using optical elements, and directed to a portion of the film's surface where a circuit-trace, or other electrical component, is later desired. Once 'light activated', the light activated portion can be used as a 'path' (or sometimes a spot) for a circuit trace to be formed later, by a metal plating step for example, typically an electroless plating step.

The number of processing steps employed to make a circuit using the composite films of the present invention are often far fewer relative to the number of steps in the subtractive processes typically employed by the industry today.

DETAILED DESCRIPTION OF THE PREFERRED EMBODIMENTS

In one embodiment of the present invention, the polyimide film composites have a visible-to-infrared light extinction coefficient of between and including any two of the following numbers 0.05, 0.06, 0.07, 0.08, 0.09, 0.1, 0.2, 0.3, 0.4, 0.5, and 0.6 per micron (or 1/micron). For purposes of the present invention, visible-to-infrared light is used to measure a light extinction coefficient for each film. The thickness of the film is used in the calculations for determining the light extinction coefficient.

As used herein, the visible-to-infrared light (400 nm to 1200 nm) extinction coefficient (sometimes referred to herein to simply as 'alpha') is a calculated number. This calculated number is found by taking the ratio of measured intensity of a specific wavelength of light (using a spectrometer) after placing a sample of the composite film in a light beam path, and dividing that number by the light intensity of the same light through air.

If one takes the natural log of this ratio and multiplies it by (−1), then divides that number by the thickness of the film (measured in microns), a visible-to-infrared light extinction coefficient can be calculated.

The general equation for the visible-to-infrared light extinction coefficient is then represented by the general formula:

$$\text{Alpha} = -1 \times [\ln(I(X)/I(O))]/t$$

where $I(X)$ represents the intensity of light transmitted through a film where $I(O)$ represent the intensity of light transmitted through air, and where $t$ represents the thickness of a film.

Typically, the film thickness in these calculations is expressed in microns. Thus, the light extinction coefficient (or alpha number) for a particular film is expressed as 1/microns, or inverse microns (e.g., microns$^{-1}$). Particular wavelengths of light useful in the measurements discussed herein are typically those wavelengths of light covering the visible-to-infrared light portion of the spectrum.

One critical aspect of the present invention was the discovery of a specific range of useful light extinction coefficients for the polyimide film composites. Specifically, it was found that the films of the present invention require a sufficient degree of 'light-absorption capability' to work effectively in high-speed light activation steps typically employing the use of certain laser machines.

For example, in one type of light-activation step employed (e.g., a step employing the use of a laser beam) it was found that the films of the present invention are capable of absorbing a significant amount of light energy so that the films can have, formed thereon, a well-defined circuit trace pattern. This can be done in a relatively short time. Conversely, commercially available polyimide films (i.e., films without these particular fillers, or films containing non-functional spinel crystal fillers) typically take too long and have too low a light extinction coefficient. As such, commercially available films will not be capable of 'light-activating' in a short period, if at all. This problem can make many polyimide film composites, even films containing relatively high loadings of certain spinel crystal fillers, incapable of absorbing enough light energy to be useful in high-speed, light activation manufacturing, as well as being able to receive plating of a metal in well-defined circuit patterns.

Polyimide films in general (as well as polyimide film composites) are prepared from a dianhydride, or the corresponding diacid-diester, diacid halide ester, or tetra-carboxylic acid derivative of the dianhydride, a diamine, an optionally an inorganic filler. For purposes of the present invention, a wide range dianhydrides and diamines were discovered to be particularly useful in the preparation of these polyimide film composites.

The polyimide component of these composites is typically synthesized by a polycondensation reaction involving the reaction of one or more aromatic diamine components with one or more aromatic dianhydride components. Generally, a polyimide can be produced by combining the above monomers together with a solvent to form a polyamic acid solution (also called a polyamide solution or polyimide precursor solution). The diarihydride and diamine components are typically combined, in a molar ratio of aromatic dianhydride component to aromatic diamine component, from 0.90 to 1.10, or from 0.98 to 1.02. Molecular weight can be adjusted by adjusting the molar ratio of the dianhydride and diamine components.

In one embodiment of the present invention, a polyamic acid solution (and/or the polyamic acid casting solution) can be prepared in an organic solvent at a polymer concentration ranging between and including any two of the following numbers 5, 10, 12, 15, 20, 25, 27, 30, 35, 40, 45, 50, 55, 60, 65, 70, 75, 80, 85, or 90 weight-percent.

Useful organic solvents, for the synthesis of the polyimides of the present invention, are preferably capable of dissolving the polyimide precursor materials. Such a solvent should also have a relatively low boiling point, such as below 225° C., so the polyimide can be dried at moderate (i.e., more convenient and less costly) temperatures. A boiling point of less than 210, 205, 200, 195, 190, or 180° C. is preferred.

Solvents of the present invention may be used alone or in combination with other solvents (i.e., cosolvents). Useful organic solvents include: N-methylpyrrolidone (NMP), dimethylacetamide (DMAc), N,N'-dimethyl-formamide (DMF), dimethyl sulfoxide (DMSO), tetramethyl urea (TMU), diethyleneglycol diethyl ether, 1,2-dimethoxyethane (monoglyme), diethylene glycol dimethyl ether (diglyme), 1,2-bis-(2-methoxyethoxy) ethane (triglyme), bis[2-(2-methoxyethoxy) ethyl)]ether (tetraglyme), gamma-butyrolactone, and bis-(2-methoxyethyl)ether, tetrahydrofuran. In one embodiment, preferred solvents include N-methylpyrrolidone (NMP) and dimethylacetamide (DMAc).

Co-solvents can also be used generally at about five to 50 weight-percent of the total solvent. Useful co-solvents include xylene, toluene, benzene, diethyleneglycol diethyl ether, 1,2-dimethoxyethane (monoglyme), diethylene glycol dimethyl ether (diglyme), 1,2-bis-(2-methoxyethoxy) ethane (triglyme), bis[2-(2-methoxyethoxy)ethyl)]ether (tetraglyme), bis-(2-methoxyethyl)ether, tetrahydrofuran, propylene glycol methyl ether, propylene glycol methyl ether acetate, "Cellosolve™", (ethylene glycol ethyl ether), butyl "Cellosolve™" (ethylene glycol butyl ether), "Cellosolve™ acetate" (ethylene glycol ethyl ether acetate), and "butyl Cellosolve™ acetate" (ethylene glycol butyl ether acetate).

For purposes of the present invention, high $T_g$ polyimides are defined herein as those polyimides having a $T_g$ greater than or equal to 300, 325, 350 and 375° C. (or polyimides having no measurable $T_g$ at all). Low $T_g$ polyimides are those polyimides having a $T_g$ of less than 300, 275, 250, 225, 200, 175 or 150° C. In one embodiment of the present invention, any aromatic dianhydride, or combination of aromatic dianhydrides, in addition to any diamine or combination of aromatic diamines, can be used as monomers to form either a high $T_g$ or low $T_g$ polyimide.

The dianhydrides of the present invention may be used alone or in combination with one another. These dianhydrides can be used in their tetra-acid form (or as mono, di, tri, or tetra esters of the tetra acid), or as their diester acid halides (chlorides). However in some embodiments, the dianhydride form can be preferred, because it is generally more reactive than the acid or the ester.

Examples of suitable aromatic dianhydrides include, 1,2, 5,6-naphthalene tetracarboxylic dianhydride, 1,4,5,8-naphthalene tetracarboxylic dianhydride, 2,3,6,7-naphthalene tetracarboxylic dianhydride, 2-(3',4'-dicarboxyphenyl) 5,6-dicarboxybenzimidazole dianhydride, 2-(3',4'-dicarboxyphenyl) 5,6-dicarboxybenzoxazole dianhydride, 2-(3',4'-dicarboxyphenyl) 5,6-dicarboxybenzothiazole dianhydride, 2,2',3,3'-benzophenone tetracarboxylic dianhydride, 2,3,3',4'-benzophenone tetracarboxylic dianhydride, 3,3',4,4'-benzophenone tetracarboxylic dianhydride (BTDA), 2,2',3,3'-biphenyl tetracarboxylic dianhydride, 2,3,3',4'-biphenyl tetracarboxylic dianhydride, 3,3',4,4'-biphenyl tetracarboxylic dianhydride (BPDA), bicyclo-[2,2,2]-octen-(7)-2,3,5,6-tetracarboxylic-2,3,5,6-dianhydride, 4,4'-thio-diphthalic anhydride, bis(3,4-dicarboxyphenyl) sulfone dianhydride, bis(3,4-dicarboxyphenyl) sulfoxide diarihydride (DSDA), bis(3,4-dicarboxyphenyl oxadiazole-1,3,4) p-phenylene dianhydride, bis(3,4-dicarboxyphenyl) 2,5-oxadiazole 1,3,4-dianhydride, b is 2,5-(3',4'-dicarboxydiphenylether) 1,3,4-oxadiazole dianhydride, 4,4'-oxydiphthalic anhydride (ODPA), bis(3,4-dicarboxyphenyl) thio ether dianhydride, 2,2'-bis[4-(3,4-dicarboxyphenoxy)phenyl]propane dianhydride (BPADA), 2,2-bis-(3,4-dicarboxyphenyl) 1,1,1,3,3,3,-hexafluoropropane dianhydride (6FDA), 5,5-[2,2,2]-trifluoro-1-(trifluoromethyl)ethylidene, bis-1,3-isobenzofurandione, 1,4-bis(4,4'-oxyphthalic anhydride) benzene, bis(3,4-dicarboxyphenyl) methane dianhydride, cyclopentadienyl tetracarboxylic acid dianhydride, cyclopentane tetracarboxylic dianhydride, ethylene tetracarboxylic acid diarihydride, perylene 3,4,9,10-tetracarboxylic dianhydride, pyromellitic dianhydride (PMDA), tetrahydrofuran tetracarboxylic dianhydride, 1,3-bis-(4,4'-oxydiphthalic anhydride) benzene, 2,2-bis(3,4-dicarboxyphenyl) propane dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, benzene-1,2,3,4-tetracarboxylic dianhydride; and thiophene-2,3,4,5-tetracarboxylic dianhydride.

For either a low $T_g$ or a high $T_g$ polyimide base polymer, a suitable aromatic diamine includes, but is not limited to, m-phenylenediamine, p-phenylenediamine, 2,5-dimethyl-1,4-diaminobenzene, trifluoromethyl-2,4-diaminobenzene, trifluoromethyl-3,5-diaminobenzene, 2,5-dimethyl-1,4-phenylenediamine (DPX), 2,2-bis-(4-aminophenyl) propane, 4,4'-diaminobiphenyl, 4,4'-diaminobenzophenone, 3,4'-diaminobenzophenone, 4,4'-diaminodiphenylmethane, 4,4'-diaminodiphenyl sulfide, 4,4'-diaminodiphenyl sulfone, 3,3'-diaminodiphenyl sulfone, bis-(4-(4-aminophenoxy)phenyl sulfone (BAPS), 4,4'-bis-(aminophenoxy)biphenyl (BAPB), 4,4'-diaminodiphenyl ether, 3,4'-diaminodiphenyl ether, 4,4'-isopropylidenedianiline, 2,2'-bis-(3-aminophenyl)propane, N,N-bis-(4-aminophenyl)-n-butylamine, N,N-bis-(4-aminophenyl) methylamine, 1,5-diaminonaphthalene, 3,3'-dimethyl-4,4'-diaminobiphenyl, m-amino benzoyl-p-amino anilide, 4-aminophenyl-3-aminobenzoate, N,N-bis-(4-aminophenyl) aniline, 2,4-diaminotoluene, 2,5-diaminotoluene, 2,6-diaminotoluene, 2,4-diamine-5-chlorotoluene, 2,4-diamine-6-chlorotoluene, 2,4-bis-(beta-amino-t-butyl) toluene, bis-(p-beta-amino-t-butyl phenyl) ether, p-bis-2-(2-methyl-4-aminopentyl) benzene, m-xylylene diamine, and p-xylylene diamine.

Other useful aromatic diamines include, 1,2-bis-(4-aminophenoxy)benzene, 1,3-bis-(4-aminophenoxy) benzene, 1,2-bis-(3-aminophenoxy)benzene, 1,3-bis-(3-aminophenoxy) benzene, 1-(4-aminophenoxy)-3-(3-aminophenoxy) benzene, 1,4-bis-(4-aminophenoxy) benzene, 1,4-bis-(3-aminophenoxy) benzene, 1-(4-aminophenoxy)-4-(3-aminophenoxy) benzene, 2,2-bis-(4-[4-aminophenoxy]phenyl) propane (BAPP), 2,2'-bis-(4-aminophenyl)-hexafluoro propane (6F diamine), 2,2'-bis-(4-phenoxy aniline) isopropylidene, 2,4,6-trimethyl-1,3-diaminobenzene, 4,4'-diamino-2,2'-trifluoromethyl diphenyloxide, 3,3'-diamino-5,5'-trifluoromethyl diphenyloxide, 4,4'-trifluoromethyl-2,2'-diaminobiphenyl, 2,4,6-trimethyl-1,3-diaminobenzene, 4,4'-oxy-bis-[2-trifluoromethyl)benzene amine] (1,2,4-OBABTF), 4,4'-oxy-bis-[3-trifluoromethyl)benzene amine], 4,4'-thio-bis-[(2-trifluoromethyl)benzene-amine], 4,4'-thio-bis[(3-trifluoromethyl)benzene amine], 4,4'-sulfoxyl-bis-[(2-trifluoromethyl)benzene amine, 4,4'-sulfoxy]-bis-[(3-trifluoromethyl)benzene amine], and 4,4'-keto-bis-[(2-trifluoromethyl)benzene amine].

Aliphatic diamines can also be used to make the polyimides of the present invention. Useful aliphatic diamines include, but are not limited to, 1,4-tetramethylenediamine, 1,5-pentamethylenediamine (PMD), 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), 1,16-hexadecamethylenediamine. The preferred aliphatic diamine is hexamethylene diamine (HMD).

Useful methods for producing polyimide film in accordance with the present invention can be found in U.S. Pat. No. 5,166,308 and U.S. Pat. No. 5,298,331 are incorporate by reference into this specification for all teachings therein. Numerous variations are also possible including:

(a.) a method wherein the diamine components and dianhydride components are preliminarily mixed together and then the mixture is added in portions to a solvent while stirring.

(b.) a method wherein a solvent is added to a stirring mixture of diamine and dianhydride components. (contrary to (a) above)

(c.) a method wherein diamines are exclusively dissolved in a solvent and then dianhydrides are added thereto at such a ratio as allowing to control the reaction rate.

(d.) a method wherein the dianhydride components are exclusively dissolved in a solvent and then amine components are added thereto at such a ratio to allow control of the reaction rate.

(e.) a method wherein the diamine components and the dianhydride components are separately dissolved in solvents and then these solutions are mixed in a reactor.

(f.) a method wherein the polyamic acid with excessive amine component and another polyamic acid with excessive dianhydride component are preliminarily formed and then reacted with each other in a reactor, particularly in such a way as to create a non-random or block copolymer.

(g.) a method wherein a specific portion of the amine components and the dianhydride components are first reacted and then the residual diamine components are reacted, or vice versa.

(h.) a method wherein the conversion chemicals are mixed with the polyamic acid to form a polyamic acid casting solution and then cast to form a gel film.

(i.) a method wherein the components are added in part or in whole in any order to either part or whole of the solvent, also where part or all of any component can be added as a solution in part or all of the solvent.

(j.) a method of first reacting one of the dianhydride components with one of the diamine components giving a first polyamic acid. Then reacting the other dianhydride component with the other amine component to give a second polyamic acid. Then combining the amic acids in any one of a number of ways prior to film formation.

The polyamic acid solutions of the present invention (and/or casting solutions) can optionally further contain any one of a number of additives. Such additives can be used as processing aids (e.g., oligomers), antioxidants, light stabilizers, light extinction coefficient modifier, flame retardant additives, anti-static agents, heat stabilizers, ultraviolet light absorbing agents, inorganic Fillers and various reinforcing agents.

In one embodiment, a light extinction coefficient modifier can be added as a partial substitute for the spinel crystal filler. Appropriate amounts of substitution can range from, between and including any two of the following numbers, 1, 2, 3, 4, 5, 10, 15, 20, 25, 30, 35, or 40 weight percent of the total amount of spinel crystal filler component. In one case, about 10 weight percent of the spinel crystal filler can be substituted with a carbon powder or graphite powder. The polymer composite formed therefrom can have a sufficient amount of spinel crystal structure present in the composite to allow metal ions to plate effectively (on the film's surface) during plating while the above mentioned amount of substitute (e.g., carbon powder) can also darken the composite sufficiently so that the material can absorb a sufficient amount of light energy (i.e., an amount of light energy that effectively light activates the surface of the material).

The polyimide composites of the present invention comprise spinel crystalline fillers, generally homogeneously dispersed, in a polyimide binder component in an amount within a range between (and including) any two of the following weight-percentages 3, 4, 5, 6, 7, 8, 9, 10, 12, 15, 18, 20, 24, 25, 28, 30, 32, 34, 35, 36, 38, 40, 42, 44, 46, 48, 50, 52, 54, 56, 58 and 60 weight-percent. Filled polyimide films containing too much spinel crystal filler can sometimes be too brittle to handle in downstream processing as these films can tend to lose their flexibility with higher loadings of filler. In addition these films may not have adequate dielectric strength (because of there being too much filler present in the composite) to be useful as a dielectric.

In one embodiment, the spinel crystal fillers of the present invention are represented by the general formula:

where A, is a metal cation typically having a valence 2, and is selected from a group comprising nickel, copper, cobalt, tin, and combinations of two or more of these, and where B is a metal cation typically having a valence of 3, and is selected from the group comprising chromium, iron, nickel, manganese, tin, copper cobalt, cadmium, zinc and combinations of two or more of these, and where O is primarily, if not in all cases, oxygen.

In one embodiment of the present invention, the metal cation A provides the primary cation component of a first metal oxide cluster, "metal oxide cluster 1" (typically a tetrahedral structure) of a spinel structure. A metal cation B provides the primary cation component of a second metal oxide cluster, "metal oxide cluster 2" (typically an octahedral structure).

In another embodiment, within the above groups A and B, any metal cation having a possible valence of 2 can be used as an "A". In addition, any metal cation having a possible valence of 3 can be used as a "B" provided that the geometric configuration of "metal oxide cluster 1" is different from the geometric configuration of "metal oxide cluster 2".

In yet another embodiment, A and B can be used as the metal cation of "metal oxide cluster 2" (typically the octahedral structure). This is true in the particular case of an 'inverse' spinel-type crystal structure typically having the general formula $B(AB)O_4$.

In one or more steps, a polyimide (or polyimide precursor like a polyamic acid) is solvated to a sufficiently low viscosity (typically, a viscosity of less than 50, 40, 30, 20, 15, 10, 9, 8, 7, 6, 5, 4, 3, 2, 1.5, 1, 0.5, 0.1, 0.05, and 0.001 kiloPoise) to allow the spinel crystalline filler (which can also be suspendable in a like or same solvent) to be adequately dispersed within the polyimide matrix. The dispersion of the spinel filler is typically done in such a manner as to avoid undue agglomeration of the primary particles in the solution, the dispersion, or the final polyimide binder. Unwanted agglomeration of the filler particles in the binder can cause unwanted interfacial voids, or other problems, in the final film composite.

The spinel crystalline filler particles can be dispersed in the polyimide precursor material (i.e., polyamic acid) directly, or can be dispersed in a like or similar solvent prior to dispersion in the polymer matrix. In one embodiment of the present invention, the spinel crystal particles are dispersed in dimethylacetamide solvent and then mixed, using a high shearing mechanical mixing apparatus, with a polyamic acid. Typically, the filler particles can be mixed in a solvent, until the particles have reached an average particle size of between any two of the following numbers 50, 100, 300, 500, 800, 1000, 2000, 3000, 4000, 5000, and 10000 nanometers. The particle dispersion is then mixed using an additional high-speed, or high-shear, mixing apparatus into a polyimide precursor material. Optionally, spinel filler can be dispersed using a variety of more favorable solvents. In some cases, these filler dispersions can have added to them a variety of known dispersing agents (e.g., like a polyamic acid) to assist in forming a stable particle dispersion for use in commercial scale production.

The spinel crystal fillers of the present invention, those particle intermixed with a polyimide binder, generally have an average particle size between and including any two of the following numbers 50, 100, 200, 250, 300, 350, 400, 450, 500, 1000, 2000, 3000, 4000, 5000 and 10000 nanometers. Generally, at least 80, 85, 90, 92, 94, 95, 96, 98, 99 or 100 percent of the dispersed spinel filler is within the above size range(s). Crystal size, in the polymer binder, can be determined by a laser particle analyzer, such as an LS130 particle size analyzer with small volume module made by Coulter®.

Ultimately, the precursor polymer (typically a polyamic acid) and the spinel crystal filler particles, are mixed together to form a relatively homogeneous blend. The blended polymer mixture is then converted into a polyimide composite material where the solids content is typically greater than 98.0, 98.5, 99.0 or 99.5 weight-percent.

Because the spinel structures of the present invention are easily dispersed in a polyimide precursor solution, often with little or no additional shearing force required, slurries formed can contain often fewer than 100, 50, 20, 10, 8, 6, 5, 4, 3, 2, or 1 parts per million (ppm) undesired agglomerates. For purposes of the present invention, undesirable agglomerates are defined as a collection of bound (adjoining) spinel crystal fillers having an average particle size of greater than 10, 11, 12, 13, 14, or 15 microns.

Typically, the composite fillers of the present invention do require some milling or filtration to breakup unwanted particle agglomeration. This is typical when attempting to adequately disperse nano-sized conventional fillers into a polyamide precursor material. Such milling and filtration can be costly, and may not be capable of removing all unwanted agglomerates.

In one embodiment of the present invention, the spinel crystal filler is dispersible, and suspendable, at 20 weight-percent in a (at least 99 weight-percent pure) dimethylacetamide solvent. After dispersing and suspending the spinel crystal filler into a solvent (optionally with the aid of a high-shear mechanical mixer) less than 15, 10, 8, 6, 4, 2 or 1 weight-percent of the filler particles by weight can precipitate out of solution when the solution was kept at rest for 72 hours at 20° C.

The spinel crystal filler, in the form of a powder, liquid dispersion, or polymer dispersion is mixed to form a polyamic acid casting solution. The polyamic acid and casting solution can further comprise any one of a number of additives. These other additives can be used as processing aids (e.g., oligomers), antioxidants, light stabilizers, flame retardant additives, anti-static agents, heat stabilizers, ultraviolet absorbing agents, inorganic fillers or various reinforcing agents. These inorganic fillers include thermally conductive fillers, like metal oxides, and electrically conductive fillers like metals and electrically conductive polymers. Common inorganic fillers are alumina, silica, silicon carbide, diamond, clay, boron nitride, aluminum nitride, titanium dioxide, dicalcium phosphate, and fumed metal oxides. Common organic fillers include polyaniline, polythiophene, polypyrrole, polyphenylenevinylene, polydialkylfluorenes, carbon black, and graphite.

The solvated mixture (the polyamic acid casting solution) can then be cast or applied onto a support, such as an endless belt or rotating drum, to give a film. Next, the solvent containing-film can be converted into a self-supporting film by baking at an appropriate temperature (thermal curing) optionally with conversion chemical reactants (i.e., chemical curing) to produce a dry film. The film can then be separated from the support before complete drying and can be molecularly oriented by additional curing via a tentering oven. The final composite film is typically a dry film that is fully thermal-cured. Fully thermally-cured for purposes of the present invention is intended to mean a polyimide wherein at least 90, 92, 94, 96, 98, 99 or 99.9 percent of the amic-acid moieties are converted to an imide moiety. Dry film, as used herein, is a defined as a film, or film composite, wherein there is less than 2, 1.5, 1.0, 0.5, 0.1, 0.05, and 0.01 weight-percent volatile (e.g., solvent or water) remaining in the polyimide film composite.

In one embodiment of the present invention, a polyimide film composite is made having a thickness of between, and including, any two of the following numbers 1, 2, 3, 4, 5, 7, 8, 9, 10, 12, 14, 16, 18, 20, 25, 30, 35, 40, 45, 50, 55, 60, 65, 70, 75, 80, 85, 90, 95, 100, 125, 150, 175 and 200 microns.

The spinel crystal fillers of the present invention, those fillers forming "metal oxide cluster 1" and "metal oxide cluster 2", together provide a singular identifiable crystal type structure having heightened susceptibility to electromagnetic radiation. This is evidenced by a measurable optical property. When these crystal structures are dispersed in a polyimide dielectric for example, at a loading level of about 30 weight percent, a "visible-to-infrared light" (400 nm to 1200 nm) extinction coefficient is measured to be, between and including any two of the following numbers, 0.05, 0.06, 0.07, 0.08, 0.09, 0.1, 0.2, 0.3, 0.4, 0.5 and 0.6 per micron. A particularly useful range of loading levels for these filler was found to be between (and including) any two of the following weight-percentages 3, 4, 5, 6, 7, 8, 9, 10, 12, 15, 18, 20, 24, 25, 28, 30, 32, 34, 35, 36, 38, 40, 42, 44, 46, 48, 50, 52, 54, 56, 58 and 60 weight-percent.

In the embodiments of the present invention, it was necessary to discover a class of spinel crystal fillers that would ultimately allow for good metal-ion deposition onto an already light-activated pathway (formed in a relatively short period via a laser beam). In addition, these fillers must have also been useful in the fact that the visible-to-infrared (400 nm to 1200 nm) light extinction coefficient of the composite would provide functionality in high-speed light activation process (i.e., 'light activate' easily with relatively low levels of light).

While not intending to be bound by a particular theory, it is believed that the spinel crystal fillers of the present invention not only serve as a suitable material to bond with a metal ion (i.e., from a downstream electroless plating step) but that these fillers also serves as a good light absorbing material to speed a light activation step. The particular type of spinel crystal fillers discovered, dispersed in a polyimide matrix for example, can produce a polyimide film composite that is both easily light activated using a laser beam, and capable of being metal plated relatively quickly in a wide variety of plating baths.

The optical property (e.g., visible-to-infrared light extinction coefficient) necessary to produce a polyimide film composite ideal for high speed light-activation processing (i.e., laser beam patterning on the surface of a film) is critical to this invention. In order to improve the speed at which these composites can be processed, it is important to have a suitable amount of certain spinel crystal fillers in the polymer matrix. It is also important to choose a type of spinel crystal filler that provides the composite formed therefrom with the appropriate degree of light absorption capability.

Similarly to the polyimide binder mentioned above, the spinel crystal filler can also be specifically selected to provide a composite having a well-defined light-activated pathway after intense light-energy has been applied to the film. For example, a well-defined light-activated pathway can more easily produce well-defined circuit metal traces after the light-activated material is submerged in an electroless-plating bath. Metal is typically deposited onto the light-activate portion of a film's surface via an electroless-plating step.

In accordance with the present invention, the monomers used to form a polyimide (i.e., the polyimide binder) are chosen to specifically provide important physical properties to the composite film. Beneficial properties specifically sought include, but are not limited to, good adhesibility (i.e., metal adhesion or adhesion to a metal), high and/or low modulus depending on the application, high mechanical elongation, a low coefficient of in-plane thermal expansion (CTE), a low coefficient of humidity expansion (CHE), a particular glass transition temperature, and high tensile strength in some applications.

In one embodiment of the present invention, the polyimide film composites have an in-plane coefficient of thermal expansion between and including any two of the following numbers 70, 68, 66, 64, 62, 60, 58, 56, 54, 52, 50, 48, 46, 44, 42, 40, 38, 36, 34, 32, 30, 28, 26, 24, 22, 20, 18, 16, 14, 12, 10, 8, 6, 4, 2, 0, −4, −8, and −10 ppm/° C.

In one embodiment, different polyimide compositions are used to form a multi-layer polyimide substrate. The multi-layer substrate polyimide can be used as at least a portion of a printed circuit board ("PCB"), chip scale package, wafer scale package, high density interconnect board (HDI), module, "LGA" Land grid array, "SOP" (System-on Package) Module, "QFN" Quad Flat package-No Leads, "FC-QFN" Flip Chip Quad Flat package-No leads, or other similar-type electronic substrate. Printed circuit boards (either covered with, or incorporating therein, the films of the present invention) may be single sided, double sided, may be incorporated into a stack, or a cable (i.e. a flexible circuit cable). Stacks can include several individual circuits to form what is commonly referred to as a multi-layer board. Any of these types of circuits may be used in a solely flexible or rigid circuit or, or may be combined to form a rigid/flex or flex/rigid printed wiring board or cable.

In one embodiment of the present invention, a high $T_g$ polyimide layer, and a low $T_g$ polyimide spinel crystal filler composite layer, can be simultaneously cast via co-extrusion. At the time of casting, the polyimides can be in the form of a polyamic acid solution. The cast solutions form an uncured polyamic acid film, filled or unfilled, that is later cured to a polyimide.

In the case of a multi-layer polyimide film, spinel crystal filler can be put in the outer layers, the inner layers, in two-layers, or in all three layers. In addition, the concentration (or loading) of the spinel crystal filler can be different, or the same, in each individual layer depending on the final properties desired. In one embodiment, a low Tg polyimide composite layer (containing a low Tg polyimide and spinel filler) can be used in conjunction with a high modulus polyimide core layer. In another embodiment, all three layers can use a high modulus polyimide and only the outer layer can contain spinel crystal filler.

In modern circuitry applications z-directional dimensional stability (through the film thickness), especially in films where the dielectric is less than 25 microns, is increasingly important. The films of the present invention generally have excellent z-axis dimensional stability (z-axis coefficient of thermal expansion) by providing an expansion factor of less than 120 ppm/° C., typically 90 ppm/° C. The coefficient of in-plane thermal expansion is measured by ASTM Method IPC-650 2.4.41 and is included herein by reference.

In one embodiment of the present invention, a means is provided whereby, electromagnetic radiation (i.e., light-energy via a laser beam) is applied to the polyimide film composite's surface. In one embodiment of the present invention, a polyimide composite can be light activated using a commercially available, Esko-Graphics Cyrel® Digital Imager (CDI). The imager can be operated in a continuous wave mode or can be operated in a pulse mode. The purpose of applying this energy, on a particular predetermined portion of the film, is to light-activate the film surface. As defined herein, the term "light-activated" is defined as a portion of a surface, on a polyimide, wherein a metal ion can bond to the surface in a manner capable of forming a metal circuit trace. In the event that only a small portion of metal can be electroless plated onto the light activated portion of a film's surface (an amount of metal typically not capable of forming an electrically conductive pathway), the film in general is not considered to be 'light activatable' for purposes herein.

Typically, a 50-watt Yttrium Aluminum Garnet (YAG) laser can be employed to light activate the polyimide film composites of the present invention. However, other types of lasers can be used. In one embodiment, a YAG laser (e.g. Chicago Laser Systems Model CLS-960-S Resistor Trimmer System) can be used to typically emit energy between 1 and 100 watts, ranging at about 355, 532 or 1064 nm wavelengths light. Generally, the wavelength of the laser light useful to light-activate a portion of the surface of a polyimide film composite can range from a wavelength between and including any two of the following numbers 400 nm, 532 nm, 1064 nm, or 3000 nm.

Generally, a laser beam can be modulated using an acousto-optic modulator/splitter/attenuator device (AOM) and can produce up to 23 watts in a single beam. The films of the present invention can be held in place by vacuum, or by adhesive (or both), on the outer surface of a drum or metal plate. A drum-type assembly can rotate the film at speeds ranging from 1 to 2000 revolutions per minute in order to reduce production time. Spot size (or beam diameter) of the laser beam can be at a focus distance of from between, and including, any two of the following numbers, 1, 2, 4, 6, 8, 10, 15, 20 or 25 microns, typically 18 or 12 microns. Average exposures (e.g. energy dose) can from between, and including, any two of the following numbers 0.1, 0.5, 1.0, 2, 4, 6, 8, 10, 15 or 20 J/cm². In at least two examples, 4 and 8 J/cm² were used.

A digital pattern of a printed circuit board, known as an 'image file', can be used to direct light to desired portions (i.e., locations) on the surface of a polyimide film composite. Software is employed to store information regarding the location of lines, spaces, curves, pads, holes, and other information such as pad diameter, pad pitch, and hole diameter. This data is then typically stored in digital memory that is readily accessible to AOM electronic devices.

Typically, laser light is controlled by a computer and moves in an organized, predetermined, pixel-by-pixel (or line-by-line) fashion across a panel or composite surface. The fine features of circuit pattern are inscribed on the composite's surface. As such, the combination of light sources, the scanning, the beam modulation, the digital pattern transfer, and the mechanical conditions stated above, are all used to determine the particular circuit pattern ultimately desired.

In one embodiment of the present invention, metal is subsequently applied to the light-activated portions of the polyimide films of the present invention after light activation. For these composites, metal can be plated onto a surface using an 'electroless' plating bath in an electroless-plating step. The plating baths typically contain a copper ion source, a reducing agent, an oxidizing agent, a chelating agent, as well as trace amounts of other functional additives.

Variables that can control the speed and quality in which a plating bath can plate metal onto a film's surface are, temperature of the plating bath, the amount of surface to be plated, the chemical balance of the solution (e.g., replenishing the plating solution with a substance that has been consumed), and the degree of mechanical agitation. Typically, the temperature range of a plating bath is controlled at a temperature between room temperature and about 70 to 80° C. The temperature is adjusted according to the type, and amount, of chelating agent (and other additives) used.

Digitally imaged circuits can be electroless copper plated by using a two step plating bath process. First, the polyimide composites of the present invention are digitally imaged by a light activation step. Light activation debris, or miscellaneous particles, can be removed by mechanical brushing, air or ultra-sonification in order for a clean electroless copper-plating step to begin. When these initial steps have been taken, the material can be submerged into the first of two electroless copper-plating baths. The material is placed in the first bath for about seven to ten minutes in order to establish a 'ground plane' of copper on the light activated areas. After a distilled water rinse, the material can then be submerged into a second electroless copper-plating bath for two to two-and-a-half hours. The second copper plating bath can build up a copper thickness, over the ground plane copper layer, of approximately twelve to twenty microns.

The advantages of the materials present invention are illustrated in the following EXAMPLES. Processing and test procedures used in preparation of, and testing, of the polyimides of the present invention (and compositions containing these polyimides) are described below.

EXAMPLES SECTION

The following examples were prepared from a polyamic acid blended with a dispersion of the below mentioned spinel crystal fillers. The polyamic acid was derived from equimolar amounts of dianhydride(s) and diamine(s). The data is summarized in the TABLE below.

TABLE

| Example # | Spinel Crystal Filler | Filler loading (weight-percent) | Film Thickness (microns) | Infrared Light extinction coefficient @ 1064 nm wavelength |
|---|---|---|---|---|
| Examples | | | | |
| 1 | $(CuFe)(CrFe)_2O_4$ | 3 | 54.1 | 0.068 |
| 2 | $(CuFe)(CrFe)_2O_4$ w/ additional 5 weight-percent talc | 5 | 40.9 | 0.075 |
| 3 | $CuCr_2O_4$ | 5 | 15.6 | 0.089 |
| 4 | $CuCr_2O_4$ | 7 | 52.7 | 0.094 |
| 5 | $CuCr_2O_4$ | 15 | 37.5 | 0.171 |
| 6 | $CuCr_2O_4$ | 20 | 15.3 | 0.248 |
| 7 | $CuCr_2O_4$ | 40 | 47.8 | 0.156 |
| 8 | $CuCr_2O_4$ | 60 | 38.6 | 0.135 |
| 9 | $(NiMn)(CrFe)_2O_4$ | 5 | 37.5 | 0.065 |
| 10 | $(NiMn)(CrFe)_2O_4$ | 7 | 58.6 | 0.088 |
| 11 | $(NiMn)(CrFe)_2O_4$ | 7 | 56.7 | 0.091 |
| 12 | $(NiMn)(CrFe)_2O_4$ | 10 | 37.5 | 0.148 |
| 13 | $(NiMn)(CrFe)_2O_4$ | 15 | 37.5 | 0.243 |
| 14 | $(NiMn)(CrFe)_2O_4$ | 20 | 18.1 | 0.323 |
| 15 | $NiCr_2O_4$/carbon powder | 7/7 | 54.4 | 0.103 |
| Comparative Examples | | | | |
| 1 | No filler in a 2 mil thick polyimide (PMDA//ODA) | 0 | 50.8 | 0.008 |
| 2 | No filler in a 1 mil thick polyimide (PMDA/BPDA//ODA/PPD) | 0 | 22.8 | 0.010 |
| 3 | $(NiMn)(CrFe)_2O_4$ | 1 | 37.5 | 0.025 |
| 4 | $CuCr_2O_4$ | 1 | 37.5 | 0.012 |
| 5 | $CuCr_2O_4$ | 1 | 99.5 | 0.017 |
| 6 | $CuCr_2O_4$ | 1 | 129.0 | 0.018 |
| 7 | $(NiMn)(CrFe)_2O_4$ | 1 | 105.2 | 0.024 |
| 8 | $(NiMn)(CrFe)_2O_4$ | 1 | 114.0 | 0.021 |
| 9 | $CuCr_2O_4$ | 1.5 | 75.2 | 0.017 |
| 10 | $CuCr_2O_4$ | 2 | 80.4 | 0.017 |
| 11 | $NiCr_2O_4$ | 14 | 62.1 | 0.040 |

Example 1

A metal oxide slurry was prepared by first adding 13.09 L of dimethyl acetamide (DMAc) to a Kady® Mill commercially available kinetic dispersion mixer. The solvent was stirred at 1000 rpms. A 10 weight-percent polyamic acid solution, dissolved in DMAc, was then added to the mill to aid in ultimately stabilizing the filler dispersion. Finally, 499.62 g of fine $(CuFe)(CrFe)_2O_4$ powder (PK 3095 from Ferro Co. GmBh) was added and allowed to mix for about 30 minutes.

0.81 gallons of the above slurry was then well dispersed, and uniformly mixed, using a Greerco® mixer, into 5.19 gallons of 17 weight-percent polyamic acid solution dissolved in DMAc.

After thorough mixing of the filler dispersion in the polyamic acid polymer, the viscosity of the mixed polymer was raised to about 1000 poise by adding an additional amount of pyromellitic dianhydride (dissolved in a 6 weight-percent solution).

Next, a thin sheet of mixed polymer (containing spinel crystal filler) was cast onto a 316 stainless belt to form a wet film. The thickness of the wet film was adjusted in order to obtain a dry film thickness of about a 2 mil (50 microns).

The metal belt was heated in an oven and ramped from 90° C. to 140° C. over about 15 minutes. The film was peeled from the belt and pinned on a tenter frame (a thermal-processing oven) where the edges of the film were bound.

Then, the tentered film was further heated to dry (>99% solids) and imidize the film by transporting it through a drying oven which was ramped from 200° C. to in excess of 350 C over a ~30 minute period. This final thin film contained approximately 3 percent by weight $(CuFe)(CrFe)_2O_4$ powder (PK 3095 from Ferro Co. GmBh) in polyimide.

Example 2

A metal oxide slurry was prepared by first adding 13.09 L of dimethyl acetamide (DMAc) to a Kady® Mill kinetic dispersion mixer. The solvent was stirred at 1000 rpms. A 10 weight-percent polyamic acid solution in DMAc, was then added to the mill to aid in the dispersion of the filler. The viscosity of the polymer was 100 poise prior to mixing and 29.78 kg of the polyamic acid solution was used. Finally, 499.62 g of fine $(CuFe)(CrFe)_2O_4$ powder (PK 3095 from Ferro Co. GmBh) was added and allowed to mix for about 30 minutes.

A talc slurry was then prepared by adding 4.07 L of dimethyl acetamide (DMAc) and 386 g of talc. The slurry was added to the Kady® Mill. The dispersion was stirred at 1000 rpms. A 10 weight-percent polyamic acid solution in DMAc was then added to the beaker to aid in the dispersion of the filler. The viscosity of the polymer was 100 poise prior to mixing. In this case, 9.27 kg of the polyamic acid solution was used.

1.17 gallons of the above metal oxide slurry was combined and uniformly mixed, using a Greerco® mixer, into 3.75 gallons of 17 weight-percent polyamic acid solution dissolved in DMAc. The viscosity of this polymer solution was also 100 poise prior to mixing with the slurry.

After thorough dispersion of the filler in the polyamic acid polymer, the viscosity of the mixed polymer was raised to 1000 poise by adding an additional amount of PMDA (dissolved in a 6 percent by weight solution).

Next, a thin sheet of mixed polymer was cast onto a 316 SS belt to form a wet film. The thickness of the wet film was adjusted in order to obtain a dry film thickness of about two mils (50 microns).

The metal belt was heated in an oven and ramped from 90° C. to 140° C. over ~15 minutes. The film was peeled from the belt and pinned on a tenter frame where the edges of the film were bound.

Then, the film was further heated to dry (>99% solids) and imidize the film by transporting it through a drying oven which was ramped from 200° C. to in excess of 350 C over a ~30 minute period.

This final thin film contained approximately 5 percent by weight $(CuFe)(CrFe)_2O_4$ powder (PK 3095 from Ferro Co. GmBh) and 5 percent by weight of talc powder in polyimide.

Example 3

A slurry was prepared by first adding 187.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 30 g of the polyamic acid solution was used. Finally, 37.5 g of fine $CuCr_2O_4$ powder (Black 20C980 from Shepherd Powder Co.) was added and allowed to mix for ~30 seconds. The dispersion was then transferred to a continuous media mill (Netzsch® Zeta Mill II) and milled 5-10 minutes to achieve a filler final average particle size of 0.6-0.7 microns.

Twenty grams of the above slurry was then well dispersed, and uniformly mixed, using the laboratory scale Silverson® mixer, into 145.26 grams of 19 weight-percent polyamic acid solution derived from 4,4'-oxydianiline (4,4'-ODA) and pyromellitic dianhydride (PMDA) dissolved in DMAc. The viscosity of this polymer solution was also 100 poise prior to mixing with the slurry.

After thorough dispersion of the filler in the polyamic acid polymer, the viscosity of the mixed polymer was raised to 1000 poise by adding an additional amount of PMDA (dissolved in a 6 percent by weight solution).

Next, a thin sheet of mixed polymer was cast onto a 316 SS plate to form a wet film. The thickness of the wet film was adjusted in order to obtain a dry film thickness of about a half mil (12.5 microns).

The metal plate was heated in a Blue M oven at 60° C. for 3 minutes and then ramped from 60° C. to 150° C. for 15 minutes. The film was peeled from the plate and placed on a pin frame where the edges of the film were bound.

Then, the pin-framed film was further heated to dry (>99% solids) and imidize the film by holding it in a Blue M oven at 300° C. for 5 minutes.

This final thin film contained approximately 5 percent by weight $CuCr_2O_4$ powder (Black 20C980 from Shepherd Powder Co) in polyimide.

Example 4

A slurry was prepared by first, adding 182.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 30 g of the polyamic acid solution was used. Finally, 37.5 g of fine $CuCr_2O_4$ powder (Black 1G from Shepherd Powder Co.) was added and allowed to mix for ~5 minutes.

14.2 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 2 mil (50 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes.

This final thin film contained approximately 7 percent by weight $CuCr_2O_4$ powder (Black 1 G from Shepherd Powder Co) in polyimide.

Example 5

A slurry was prepared by first adding 187.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc, was then added to the beaker to aid in the dispersion of the filler. The viscosity of the polymer was 100 poise prior to mixing. In this case, 30 g of the polyamic acid solution was used. Finally, 37.5 g of fine $CuCr_2O_4$ powder (Black 20C980 from Shepherd Powder Co.) was added and allowed to mix for ~30 seconds. The dispersion was then transferred to a continuous media mill (Netzsch Zeta Mill 11) and milled 5-10 minutes to achieve a final average filler particle size of 0.6-0.7 microns.

Forty grams of the above slurry was then well dispersed, and uniformly mixed, using the laboratory scale Silverson® mixer, into 170.78 grams of 19 weight-percent polyamic acid solution derived from 4,4'-oxydianiline (4,4'-ODA) and pyromellitic dianhydride (PMDA) dissolved in DMAc. The viscosity of this polymer solution was also 100 poise prior to mixing with the slurry.

After thorough dispersion of the filler in the polyamic acid polymer, the viscosity of the mixed polymer was raised to 1000 poise by adding an additional amount of PMDA (dissolved in a 6 percent by weight solution).

Next, a thin sheet of mixed polymer was cast onto a 316 SS plate to form a wet film. The thickness of the wet film was adjusted in order to obtain a dry film thickness of about one and a half mil (37.5 microns).

The metal plate was heated in a Blue M oven at 60° C. for 3 minutes and then ramped from 60° C. to 150° C. for 15 minutes. The film was peeled from the plate and placed on a pin frame where the edges of the film were bound.

Then, the pin-framed film was further heated to dry (>99% solids) and imidize the film by holding it in a Blue M oven at 300° C. for 5 minutes. This final thin film contained approximately 15 percent by weight $CuCr_2O_4$ powder (Black 20C980 from Shepherd Powder Co) in polyimide.

Example 6

A slurry was prepared by first adding 187.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc, was then added to the beaker to aid in the dispersion of the filler. The viscosity of the polymer was 100 poise prior to mixing. In this case, 30 g of the polyamic acid solution was used. Finally, 37.5 g of fine $CuCr_2O_4$ powder (Black 20C980 from Shepherd Powder Co.) was added and allowed to mix for ~30 seconds. The dispersion was then transferred to a continuous media mill (Netzsch Zeta Mill II) and milled 5-10 minutes to achieve a final average filler particle size of 0.6-0.7 microns.

Forty grams of the above slurry was then well dispersed, and uniformly mixed, using the laboratory scale Silverson® mixer, into 122.7 grams of 19 weight-percent polyamic acid solution derived from 4,4'-oxydianiline (4,4'-ODA) and pyromellitic dianhydride (PMDA) dissolved in DMAc. The viscosity of this polymer solution was also 100 poise prior to mixing with the slurry.

After thorough dispersion of the filler in the polyamic acid polymer, the viscosity of the mixed polymer was raised to 1000 poise by adding an additional amount of PMDA (dissolved in a 6 percent by weight solution).

Next, a thin sheet of mixed polymer was cast onto a 316 SS plate to form a wet film. The thickness of the wet film was adjusted in order to obtain a dry film thickness of about a half mil (12.5 microns).

The metal plate was heated in a Blue M oven at 60° C. for 3 minutes and then ramped from 60° C. to 150° C. for 15 minutes. The film was peeled from the plate and placed on a pin frame where the edges of the film were bound.

Then, the pin-framed film was further heated to dry (>99% solids) and imidize the film by holding it in a Blue M oven at 300° C. for 5 minutes. This final thin film contained approximately 20 percent by weight $CuCr_2O_4$ powder (Black 20C980 from Shepherd Powder Co) in polyimide.

Example 7

A slurry was prepared by first, adding 730 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc, was then added to the beaker to aid in the dispersion of the filler. The viscosity of the polymer was 100 poise prior to mixing. In this case, 120 g of the polyamic acid solution was used. Finally, 150 g of fine $CuCr_2O_4$ powder (Black 20C980 from Shepherd Powder Co.) was added and allowed to mix for ~5 minutes. The dispersion was then transferred to a continuous media mill (Netzsch Zeta Mill II) and milled 15 minutes to achieve a final average filler particle size of 1.1-1.5 microns.

130 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 2 mil (50 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes.

This final thin film contained approximately 40 percent by weight $CuCr_2O_4$ powder (Black 20C980 from Shepherd Powder Co) in polyimide.

Example 8

A slurry was prepared by first, adding 730 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc, was then added to the beaker to aid in the dispersion of the filler. The viscosity of the polymer was 100 poise prior to mixing. In this case, 120 g of the polyamic acid solution was used. Finally, 150 g of fine $CuCr_2O_4$ powder (Black 20C980 from Shepherd Powder Co.) was added and allowed to mix for ~5 minutes. The dispersion was then transferred to a continuous media mill (Netzsch Zeta Mill II) and milled 15 minutes to achieve a final average filler particle size of 1.1-1.5 microns.

170 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. In this case 18.5 g of Black 20C980 powder was added directly to the dispersion and mixed in rigorously by hand. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 2 mil (50 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes. This final thin film contained approximately 60 percent by weight $CuCr_2O_4$ powder (Black 20C980 from Shepherd Powder Co) in polyimide.

Example 9

A slurry was prepared by first, adding 152.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc, was then added to the beaker to aid in the dispersion of the filler. The viscosity of the polymer was 100 poise prior to mixing. In this case, 60 g of the polyamic acid solution was used. Finally, 37.5 g of fine $(NiMn)(CrFe)_2O_4$ powder (Black 376A from Shepherd Powder Co.) was added and allowed to mix for ~30 seconds. The dispersion was then transferred to a continuous media mill (Netzsch Zeta Mill II) and milled 20 minutes to achieve a final average filler particle size of 0.7-0.9 microns.

Ten grams of the above slurry was then well dispersed, and uniformly mixed, using the laboratory scale Silverson® mixer, into 144.37 grams of 19 weight-percent polyamic acid solution derived from 4,4'-oxydianiline (4,4'-ODA) and pyromellitic dianhydride (PMDA) dissolved in DMAc. The viscosity of this polymer solution was also 100 poise prior to mixing with the slurry.

After thorough dispersion of the filler in the polyamic acid polymer, the viscosity of the mixed polymer was raised to 1000 poise by adding an additional amount of PMDA (dissolved in a 6 percent by weight solution).

Next, a thin sheet of mixed polymer was cast onto a 316 SS plate to form a wet film. The thickness of the wet film was adjusted in order to obtain a dry film thickness of about one and a half mil (37.5 microns).

The metal plate was heated in a Blue M oven at 60° C. for 3 minutes and then ramped from 60° C. to 150° C. for 15 minutes. The film was peeled from the plate and placed on a pin frame where the edges of the film were bound.

Then, the pin-framed film was further heated to dry (>99% solids) and imidize the film by holding it in a Blue M oven at 300° C. for 5 minutes.

This final thin film contained approximately 5 percent by weight $(NiMn)(CrFe)_2O_4$ powder (Black 376A from Shepherd Powder Co) in polyimide.

Example 10

A slurry was prepared by first, adding 182.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc, was then added to the beaker to aid in the dispersion of the filler. The viscosity of the polymer was 100 poise prior to mixing. In this case, 30 g of the polyamic acid solution was used. Finally, 37.5 g of fine (NiMn)(CrFe)$_2$O$_4$ powder (Black 242 from Shepherd Powder Co.) was added and allowed to mix for ~5 minutes.

14.1 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 2 mil (50 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes.

This final thin film contained approximately 7 percent by weight (NiMn)(CrFe)$_2$O$_4$ powder (Black 242 from Shepherd Powder Co) in polyimide.

Example 11

A slurry was prepared by first, adding 182.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc, was then added to the beaker to aid in the dispersion of the filler. The viscosity of the polymer was 100 poise prior to mixing. In this case, 30 g of the polyamic acid solution was used. Finally, 37.5 g of fine (NiMn)(CrFe)$_2$O$_4$ powder (Black 462 from Shepherd Powder Co.) was added and allowed to mix for ~5 minutes.

14.1 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 2 mil (50 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes.

This final thin film contained approximately 7 percent by weight (NiMn)(CrFe)$_2$O$_4$ powder (Black 462 from Shepherd Powder Co) in polyimide.

Example 12

A slurry was prepared by first, adding 152.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc, was then added to the beaker to aid in the dispersion of the filler. The viscosity of the polymer was 100 poise prior to mixing. In this case, 60 g of the polyamic acid solution was used. Finally, 37.5 g of fine (NiMn)(CrFe)$_2$O$_4$ powder (Black 376A from Shepherd Powder Co.) was added and allowed to mix for ~30 seconds. The dispersion was then transferred to a continuous media mill (Netzsch Zeta Mill II) and milled 20 minutes to achieve a final average filler particle size of 0.7-0.9 microns.

Twenty grams of the above slurry was then well dispersed, and uniformly mixed, using the laboratory scale Silverson® mixer, into 134.9 grams of 19 weight-percent polyamic acid solution derived from 4,4'-oxydianiline (4,4'-ODA) and pyromellitic dianhydride (PMDA) dissolved in DMAc. The viscosity of this polymer solution was also 100 poise prior to mixing with the slurry.

After thorough dispersion of the filler in the polyamic acid polymer, the viscosity of the mixed polymer was raised to 1000 poise by adding an additional amount of PMDA (dissolved in a 6 percent by weight solution).

Next, a thin sheet of mixed polymer was cast onto a 316 SS plate to form a wet film. The thickness of the wet film was adjusted in order to obtain a dry film thickness of about one and a half mil (37.5 microns).

The metal plate was heated in a Blue M oven at 60° C. for 3 minutes and then ramped from 60° C. to 150° C. for 15 minutes. The film was peeled from the plate and placed on a pin frame where the edges of the film were bound.

Then, the pin-framed film was further heated to dry (>99% solids) and imidize the film by holding it in a Blue M oven at 300° C. for 5 minutes.

This final thin film contained approximately 10 percent by weight (NiMn)(CrFe)$_2$O$_4$ powder (Black 376A from Shepherd Powder Co) in polyimide.

Example 13

A slurry was prepared by first, adding 152.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 60 g of the polyamic acid solution was used. Finally, 37.5 g of fine (NiMn)(CrFe)$_2$O$_4$ powder (Black 376A from Shepherd Powder Co.) was added and allowed to mix for ~30 seconds. The dispersion was then transferred to a continuous media mill (Netzsch Zeta Mill II) and milled 20 minutes to achieve a final average filler particle size of 0.7-0.9 microns.

Thirty grams of the above slurry was then well dispersed, and uniformly mixed, using the laboratory scale Silverson® mixer, into 128.6 grams of 19 weight-percent polyamic acid solution derived from 4,4'-oxydianiline (4,4'-ODA) and pyromellitic dianhydride (PMDA) dissolved in DMAc. The viscosity of this polymer solution was also 100 poise prior to mixing with the slurry.

After thorough dispersion of the filler in the polyamic acid polymer, the viscosity of the mixed polymer was raised to 1000 poise by adding an additional amount of PMDA (dissolved in a 6 percent by weight solution).

Next, a thin sheet of mixed polymer was cast onto a 316 SS plate to form a wet film. The thickness of the wet film was adjusted in order to obtain a dry film thickness of about one and a half mil (37.5 microns).

The metal plate was heated in a Blue M oven at 60° C. for 3 minutes and then ramped from 60° C. to 150° C. for 15 minutes. The film was peeled from the plate and placed on a pin frame where the edges of the film were bound.

Then, the pin-framed film was further heated to dry (>99% solids) and imidize the film by holding it in a Blue M oven at 300° C. for 5 minutes.

This final thin film contained approximately 15 percent by weight (NiMn)(CrFe)$_2$O$_4$ powder (Black 376A from Shepherd Powder Co) in polyimide.

Example 14

A slurry was prepared by first adding 152.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 60 g of the polyamic acid solution was used. Finally, 37.5 g of fine (NiMn)(CrFe)$_2$O$_4$ powder (Black 376A from Shepherd Powder Co.) was added and allowed to mix for ~30 seconds. The dispersion was then transferred to a continuous media mill (Netzsch Zeta Mill II) and milled 5-10 minutes to achieve a final average filler particle size of 0.7-0.9 microns.

Forty grams of the above slurry was then well dispersed, and uniformly mixed, using the laboratory scale Silverson® mixer, into 116 grams of 19 weight-percent polyamic acid solution derived from 4,4'-oxydianiline (4,4'-ODA) and pyromellitic dianhydride (PMDA) dissolved in DMAc. The viscosity of this polymer solution was also 100 poise prior to mixing with the slurry.

After thorough dispersion of the filler in the polyamic acid polymer, the viscosity of the mixed polymer was raised to 1000 poise by adding an additional amount of PMDA (dissolved in a 6 percent by weight solution).

Next, a thin sheet of mixed polymer was cast onto a 316 SS plate to form a wet film. The thickness of the wet film was adjusted in order to obtain a dry film thickness of about a half mil (12.5 microns).

The metal plate was heated in a Blue M oven at 60° C. for 3 minutes and then ramped from 60° C. to 150° C. for 15 minutes. The film was peeled from the plate and placed on a pin frame where the edges of the film were bound.

Then, the pin-framed film was further heated to dry (>99% solids) and imidize the film by holding it in a Blue M oven at 300° C. for 5 minutes.

This final thin film contained approximately 20 percent by weight (NiMn)(CrFe)$_2$O$_4$ powder (Black 376A from Shepherd Powder Co) in polyimide.

Example 15

A slurry was prepared by first, adding 121.6 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 40 g of the polyamic acid solution was used. Finally, 25 g of fine NiCr$_2$O$_4$ powder (from Cerac) and 25 g of fine carbon black (X1396 from DuPont) were added and allowed to mix for ~5 minutes. The dispersion was then transferred to a continuous media mill (Netzsch Zeta Mill II) and milled 20 minutes to achieve a final average filler particle size of 0.7-0.9 microns.

19.5 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 2 mil (50 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M® oven from 150° C. to 250° C. over 1 hour and placed in another Blue M oven at 400° C. for 5 minutes.

This final thin film contained approximately 7 percent by weight NiCr$_2$O$_4$ and 7 percent by weight carbon black powder in polyimide.

Comparative Example 1

A 20 weight-percent polyamic acid solution derived from 4,4'-oxydianiline (ODA) and pyromellitic dianhydride (PMDA) made in DMAc. The viscosity of this polymer solution began at 100 poise prior to casting.

The viscosity of the polymer was raised to 1000 poise by adding an additional amount of PMDA (dissolved in a 6 percent by weight solution).

Next, a thin sheet of mixed polymer was cast onto a 316 SS belt to form a wet film. The thickness of the wet film was adjusted in order to obtain a dry film thickness of about a 2 mil (50 microns).

The metal belt was heated in an oven and ramped from 90° C. to 140° C. over ~15 minutes. The film was peeled from the belt and pinned on a tenter frame where the edges of the film were bound.

Then, the tentered film was further heated to dry (>99% solids) and imidize the film by transporting it through a drying oven which was ramped from 200 C to in excess of 350 C over a 10-30 minute period This final thin film represents a pure PMDA/ODA polyimide film.

Comparative Example 2

A 14.5 weight-percent polyamic acid solution, derived from 4,4'-oxydianiline (ODA), p-phenylene diamine (PPD), pyromellitic dianhydride (PMDA), and bi-phenylene dianhydride (BPDA), was made in DMAc. The viscosity of the polymer was 100 poise prior to mixing. The viscosity of this polymer solution was 100 poise prior to casting.

The viscosity of the mixed polymer was raised to 1000 poise by adding an additional amount of PMDA (dissolved in a 6 percent by weight solution).

Next, a thin sheet of mixed polymer was cast onto a 316 SS belt to form a wet film. The thickness of the wet film was adjusted in order to obtain a dry film thickness of about a 1 mil (25 microns).

The metal belt was heated in an oven and ramped from 90° C. to 140° C. over ~15 minutes. The film was peeled from the belt and pinned on a tenter frame where the edges of the film were bound.

Then, the tentered film was further heated to dry (>99% solids) and imidize the film by transporting it through a drying oven which was ramped from 200 C to in excess of 350 C over a ~30 minute period. This final thin film represents an unfilled, no filler, polyimide film derived from PMDA/BPDA//PPD/ODA monomers.

Comparative Example 3

A slurry was prepared by first adding 152.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 60 g of the polyamic acid solution was used. Finally, 37.5 g of fine $(NiMn)(CrFe)_2O_4$ powder (Black 376A from Shepherd Powder Co.) was added and allowed to mix for ~30 seconds. The dispersion was then transferred to a continuous media mill (Netzsch Zeta Mill II) and milled 5-10 minutes to achieve a final average filler particle size of 0.7-0.9 microns.

Two grams of the above slurry was then well dispersed, and uniformly mixed, using the laboratory scale Silverson® mixer, into 152 grams of 19 weight-percent polyamic acid solution derived from 4,4'-oxydianiline (4,4'-ODA) and pyromellitic dianhydride (PMDA) dissolved in DMAc. The viscosity of this polymer solution was also 100 poise prior to mixing with the slurry.

After thorough dispersion of the filler in the polyamic acid polymer, the viscosity of the mixed polymer was raised to 1000 poise by adding an additional amount of PMDA (dissolved in a 6 percent by weight solution).

Next, a thin sheet of mixed polymer was cast onto a 316 SS plate to form a wet film. The thickness of the wet film was adjusted in order to obtain a dry film thickness of about one and a half mil (37.5 microns).

The metal plate was heated in a Blue M oven at 60° C. for 3 minutes and then ramped from 60° C. to 150° C. for 15 minutes. The film was peeled from the plate and placed on a pin frame where the edges of the film were bound.

Then, the pin-framed film was further heated to dry (>99% solids) and imidize the film by holding it in a Blue M oven at 300° C. for 5 minutes.

This final thin film contained approximately 1 percent by weight $(NiMn)(CrFe)_2O_4$ powder (Black 376A from Shepherd Powder Co) in polyimide.

Comparative Example 4

A slurry was prepared by first, adding 187.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 30 g of the polyamic acid solution was used. Finally, 37.5 g of fine $CuCr_2O_4$ powder (Black 20C980 from Shepherd Powder Co.) was added and allowed to mix for ~30 seconds. The dispersion was then transferred to a continuous media mill (Netzsch Zeta Mill II) and milled 5-10 minutes to achieve a final average filler particle size of 0.6-0.7 microns.

Two grams of the above slurry was then well dispersed, and uniformly mixed, using the laboratory scale Silverson® mixer, into 152.13 grams of 19 weight-percent polyamic acid solution derived from 4,4'-oxydianiline (4,4'-ODA) and pyromellitic dianhydride (PMDA) dissolved in DMAc. The viscosity of this polymer solution was also 100 poise prior to mixing with the slurry.

After thorough dispersion of the filler in the polyamic acid polymer, the viscosity of the mixed polymer was raised to 1000 poise by adding an additional amount of PMDA (dissolved in a 6 percent by weight solution).

Next, a thin sheet of mixed polymer was cast onto a 316 SS plate to form a wet film. The thickness of the wet film was adjusted in order to obtain a dry film thickness of about one and a half mil (37.5 microns).

The metal plate was heated in a Blue M oven at 60° C. for 3 minutes and then ramped from 60° C. to 150° C. for 15 minutes. The film was peeled from the plate and placed on a pin frame where the edges of the film were bound.

Then, the pin-framed film was further heated to dry (>99% solids) and imidize the film by holding it in a Blue M oven at 300° C. for 5 minutes.

This final thin film contained approximately one percent by weight $CuCr_2O_4$ powder (Black 20C980 from Shepherd Powder Co) in polyimide.

Comparative Example 5

A slurry was prepared by first, adding 182.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc, was then added to the beaker to aid in the dispersion of the filler. The viscosity of the polymer was 100 poise prior to mixing. In this case, 30 g of the polyamic acid solution was used. Finally, 37.5 g of fine $CuCr_2O_4$ powder (Black 1 from Shepherd Powder Co.) was added and allowed to mix for ~5 minutes.

1.9 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 5 mil (125 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes.

This final thin film contained approximately 1 percent by weight $CuCr_2O_4$ powder (Black 1 from Shepherd Powder Co) in polyimide Comparative Example 6

A slurry was prepared by first, adding 182.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 30 g of the polyamic acid solution was used. Finally, 37.5 g of fine $CuCr_2O_4$ powder (Black 1G from Shepherd Powder Co.) was added and allowed to mix for ~5 minutes.

1.9 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 5 mil (125 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes.

This final thin film contained approximately 1 percent by weight $CuCr_2O_4$ powder (Black 1 G from Shepherd Powder Co) in polyimide.

Comparative Example 7

A slurry was prepared by first, adding 182.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 30 g of the polyamic acid solution was used. Finally, 37.5 g of fine $(NiMn)(CrFe)_2O_4$ powder (Black 242 from Shepherd Powder Co.) was added and allowed to mix for ~5 minutes.

1.9 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 5 mil (125 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes.

This final thin film contained approximately 1 percent by weight $(NiMn)(CrFe)_2O_4$ powder (Black 242 from Shepherd Powder Co) in polyimide.

Comparative Example 8

A slurry was prepared by first, adding 182.5 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 30 g of the polyamic acid solution was used. Finally, 37.5 g of fine $(NiMn)(CrFe)_2O_4$ powder (Black 462 from Shepherd Powder Co.) was added and allowed to mix for ~5 minutes.

1.9 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 5 mil (125 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes.

This final thin film contained approximately 1 percent by weight $(NiMn)(CrFe)_2O_4$ powder (Black 462 from Shepherd Powder Co) in polyimide.

Comparative Example 9

A slurry was prepared by first adding 730 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 120 g of the polyamic acid solution was used. Finally, 150 g of fine $CuCr_2O_4$ powder (Black 20C980 from Shepherd Powder Co.) was added and allowed to mix for ~5 minutes. The dispersion was then transferred to a continuous media mill (Netzsch Zeta Mill II) and milled 15 minutes to achieve a final average filler particle size of 1.1-1.5 microns.

2.7 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 2 mil (50 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes.

This final thin film contained approximately 1.5 percent by weight $CuCr2O4$ powder (Black 20C980 from Shepherd Powder Co) in polyimide.

Comparative Example 10

A slurry was prepared by first, adding 730 g of dimethyl acetamide (DMAc) to a beaker. The beaker was then mounted under a laboratory scale Silverson® mixer, and the solvent was stirred at ~3000 rpm. A 14.25 weight-percent polyamic acid solution in DMAc was then added to the beaker to aid in the dispersion of the filler. The viscosity of the polymer was 100 poise prior to mixing. In this case, 120 g of the polyamic acid solution was used. Finally, 150 g of fine $CuCr_2O_4$ powder (Black 20C980 from Shepherd Powder Co.) was added and allowed to mix for ~5 minutes. The dispersion was then transferred to a continuous media mill (Netzsch Zeta Mill II) and milled 15 minutes to achieve a final average filler particle size of 1.1-1.5 microns.

3.6 grams of the above slurry was then uniformly mixed, using hand stirring technique, into 150 grams of 19.5 weight-percent polyamic acid solution derived from 4,4'-oxydianiline (4,4'-ODA) and pyromellitic dianhydride (PMDA) dissolved in DMAc. The viscosity of this polymer solution was 1000 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 2 mil (50 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes.

This final thin film contained approximately 2 percent by weight $CuCr_2O_4$ powder (Black 20C980 from Shepherd Powder Co) in polyimide.

Comparative Example 11

A slurry was prepared by first, adding 30 g of dimethyl acetamide (DMAc) to a beaker. The beaker was then mounted under a laboratory scale Silverson® mixer, and the solvent was stirred at ~3000 rpm. 1.632 g of Nafion® was then added to the beaker to aid in the dispersion of the filler. Finally, 8 g of fine $NiCr_2O_4$ powder (from Cerac) was added and allowed to mix for ~2 hours.

All of the above slurry was then uniformly mixed, using a hand stirring technique, into 300 grams of a 17 weight-percent polyamic acid solution, dissolved in DMAc. The viscosity of this polymer solution was 1200 poise prior to mixing with the slurry. The mixture was centrifuged for 2-3 minutes to remove bubbles.

Next, a thin sheet of mixed polymer was cast onto a glass plate to form a wet film. The thickness of the wet film was adjusted in order to obtain a dry film thickness of about a 2 mil (50 microns).

The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. over 1 hour and placed in another Blue M oven at 400° C. for 5 minutes.

This final thin film contained approximately 14 percent by weight $NiCr_2O_4$ powder (from Cerac) in polyimide.

What is claimed is:

1. A laser light activatable, platable, polyimide film comprising:
    A. a polyimide polymer present in an amount from 50 to 97 weight-percent of the total weight of the polyimide composite film, and
    B. a spinel crystal filler present in an amount from 3 to 50 weight-percent of the total weight of the polyimide composite film,
    wherein the polyimide film has a 400 nm to 1200 nm light extinction coefficient from 0.05 to 0.6 per micron,
    wherein the spinel crystal filler is represented by a chemical formula $AB_2O_4$ or $BABO_4$, where A is a metal cation having a valence of 2 selected from a group consisting of nickel, copper, cobalt, tin, and combinations of two or more of these, and where B is a metal cation having a valence of 3 selected from a group consisting of cadmium, manganese, nickel, copper, cobalt, iron, tin, titanium, aluminum, chromium, and combinations of two or more of these, and
    wherein the polyimide film is a laser light activatable, platable, film.

2. The laser light activatable, platable, polyimide self-supporting composite film in accordance with claim 1 wherein B is an element from the periodic table selected from the group consisting of chromium, iron, aluminum, nickel, manganese, tin, and combinations of two or more of these.

3. The laser light activatable, platable, polyimide self-supporting composite film in accordance with claim 1 wherein the spinel crystal filler has an average particle size from 50 to 100 nanometers.

4. The laser light activatable, platable, polyimide self-supporting composite film in accordance with claim 1 wherein the film has a thickness from 2 to 200 microns.

5. The laser light activatable, platable, polyimide self-supporting composite film in accordance with claim 1 wherein the film has an in-plane coefficient of thermal expansion from 70 to −10 ppm/° C.

6. A two-layer laser light activatable, platable, polyimide self-supporting composite film having a top layer and a bottom layer, the top layer consisting essentially of:
    A. a polyimide polymer present in an amount from 50 to 97 weight-percent based on the total weight of the top layer,
    B. a spinel crystal filler present in an amount from 3 to 50 weight-percent based on the total weight of the top layer, and
    C. wherein the polyimide film has a 400 nm to 1200 nm light extinction coefficient from 0.05 to 0.6 per micron,
    wherein the spinel crystal filler is represented by a chemical formula $AB_2O_4$ or $BABO_4$, where A is a metal cation having a valence of 2 selected from a group consisting of nickel, copper, cobalt, tin, and combinations of two or more of these, and where B is a metal cation having a valence of 3 selected from a group consisting of cadmium, manganese, nickel, zinc, copper, cobalt, iron, magnesium, tin, titanium, iron, aluminum, nickel, manganese, chromium, and combinations of two or more of these.
    and wherein the bottom layer comprises a polyimide.

7. The two-layer laser light activatable, platable, polyimide self-supporting composite film in accordance with claim 6 wherein the bottom layer comprises a- polyimide having a glass transition temperature from 150 to 300° C.

8. The two-layer laser light activatable, platable, polyimide self-supporting composite film in accordance with claim 6 wherein the top layer polyimide has an in plane coefficient of thermal expansion from 70 to −10 ppm/° C.

9. A three-layer laser light activatable, platable, polyimide self-supporting composite film wherein at least one of the layers consists essentially of:
    A. a polyimide polymer present in an amount from 50 to 97 weight-percent based on the total weight of the top layer,
    B. a spinel crystal filler present in an amount from 3 to 50 weight-percent based on the total weight of the top layer, and C. wherein wherein the polyimide film has a 400 nm to 1200 nm light extinction coefficient of 0.05 to 0.6 per micron, wherein the spinel crystal filler is represented by a chemical formula $AB_2O_4$ or $BABO_4$, where A is a metal cation having a valence of 2 selected from a group consisting of nickel, copper, cobalt, tin, and combinations of two or more of these, and where B is a metal cation having a valence of 3 selected from a group consisting of cadmium, manganese, nickel, zinc, copper, cobalt, iron, tin, aluminum, chromium, and combinations of two or more of these.

10. The three-layer laser light activatable, platable polyimide self-supporting composite film in accordance with claim 9 wherein the outer layer comprises a polyimide polymer having a glass transition temperature from 150 to 300° C.

11. The three-layer laser light activatable, platable polyimide self-supporting composite film in accordance with claim 9 wherein the outer layer comprises a polyimide composite having an in-plane coefficient of thermal expansion from 40 to −10ppm/° C.

12. A process for making a laser light activatable, platable, polyimide film comprising,
   A. dispersing a spinel crystal filler in an organic solvent, optionally with a polyamic acid polymer used as a dispersing agent, wherein the average particle size of the spinel crystal filler is from 50 to 100 nanometers to form dispersion,
   B. mixing the dispersion with a polyamic acid to form mixed polymer blend,
   C. casting the mixed polymer blend onto a flat surface to form a wet polyamic film composite, and
   D. applying thermal energy to the wet polyamic film composite to dry and cure the composite to form a polyimide film composite wherein the polyimide composite has a 400 nm to 1200 nm light extinction coefficient between from 0.05 to 0.6 per micron.

13. The process of claim 12 further comprising the steps,
   A. light-activating a portion of the polyimide film composite with a laser beam to form light activated portions on the composite's surface, and
   B. plating the polyimide film composite with a metal using at least one electroless plating bath to form electrically conductive pathways on the light activated portions of the polyimide film composite.

14. The laser light activatable, platable, polyimide film in accordance with claim 1 further comprising an antioxidant, a light stabilizer, a light extinction coefficient modifier, a flame retardant additive, an anti-static agent, a heat stabilizer, a reinforcing agent, or dicalcium phosphate.

15. The laser light activatable, platable, polyimide film in accordance with claim 14 wherein the light extinction coefficient modifier is a carbon powder or graphite powder.

* * * * *